United States Patent [19]

Murashima et al.

[11] Patent Number: 5,258,950
[45] Date of Patent: Nov. 2, 1993

[54] SEMICONDUCTOR MEMORY DEVICE

[75] Inventors: Yoshihiro Murashima; Yoshimasa Sekino, both of Tokyo, Japan

[73] Assignee: Oki Electric Industry Co., Ltd., Tokyo, Japan

[21] Appl. No.: 747,660

[22] Filed: Aug. 21, 1991

[30] Foreign Application Priority Data

Aug. 27, 1990 [JP] Japan .................. 2-224771

[51] Int. Cl.⁵ .............................................. G11C 11/40
[52] U.S. Cl. .................. 365/189.05; 365/189.07; 365/226
[58] Field of Search .............. 365/189.07, 189.09, 365/189.05, 226, 149

[56] References Cited

U.S. PATENT DOCUMENTS 4,873,673 10/1989 Hori et al. .................. 365/230.06
4,930,112 5/1990 Tanaka et al. .................. 365/226

FOREIGN PATENT DOCUMENTS 4010103 10/1990 Fed. Rep. of Germany.
55-53757 4/1980 Japan .................. 365/189.07

OTHER PUBLICATIONS

IEEE International Solid State Circuits Conference, vol. 32, Feb. 17th, 1989, Takeshima et al., "A 55ns 16Mb DRAM", pp. 246-247.

Primary Examiner—Joseph A. Popek
Attorney, Agent, or Firm—Spencer, Frank & Schneider

[57] ABSTRACT

In a semiconductor memory device having memory cells ($21_i$, $21_{i+1}$) disposed at intersections of bit lines (BL, $\overline{BL}$) and word lines ($WL_i$, $WL_{i+1}$) and operating on an internal power source voltage ($V_D$) which is lower than an external power source voltage for the memory device, sense amplifiers (41) are activated by a voltage on a drive common node (NS), and a comparator (110) is activated by the control signal (PAS) and compares the voltage on the common node (PS) with the internal power source voltage ($V_D$). The comparator has an output which is in a first state when the common node (PS) voltage is not higher than the reference voltage ($V_R$) and which is in a second state when the common node (PS) voltage exceeds the reference voltage ($V_R$). A latch circuit (120) is turned from a first state to a second state when the control signal (PAS) is turned active, thereby to activate the comparator (110) and a power source supply circuit (130, 132) which then supplies a drive voltage to the common node (PS). The latch circuit is turned from the first state to the second state when the output of the comparator (110) is turned to the second state. The latch circuit deactivates the comparator (110) when it is turned to the first state.

22 Claims, 6 Drawing Sheets

SEMICONDUCTOR MEMORY DEVICE

FIELD OF THE INVENTION

The present invention relates to a semiconductor memory device such as a dynamic RAM (random access memory) or a static RAM, and more particularly to a method of controlling supply of power to the memory cell array.

BACKGROUND OF THE INVENTION

A conventional technique in this field is disclosed in Technical Paper of the Institute of Electronics, Information and Communication Engineers of Japan, 89n[67] (1989-6-2), Koike, et al "55 ns 16 Mb DRAM with Built-in-Self-Test Function Using Micro-Program ROM", pp. 79-80.

As described in this publication, the memory size of a semiconductor memory device, e.g., a dynamic RAM of a large capacity, is small, so the breakdown voltage of the transistor forming the cell array is low. To improve the reliability, the power source voltage $V_{CC}$ (e.g., 5 V) needs to be lowered. Accordingly, use is made of a power source supply control section which produces, from the externally-supplied power source voltage (primary or main power source voltage) $V_{CC}$ an internal (secondary or auxiliary) power source voltage $V_D$ (e.g., 3.3 V), which is then used for driving the memory cell array. An example of such a dynamic RAM is shown in FIG. 2.

FIG. 2 is a circuit diagram of the pertinent portion of the conventional semiconductor memory device.

The semiconductor memory device is a dynamic RAM, comprising a memory cell array section 10, and a power source supply control section 60 for supplying a drive voltage to the memory cell array 10.

The memory cell array section 10 comprises a data storage memory cell section 20, a transfer gate section 30 for transferring data of the memory cell section 20, a sense amplifier section 40 for sensing and amplifying a minute read voltage from the memory cell section 20, and a column decode section 60 for selecting the output of the sense amplifier section 40.

In the memory cell section 20, a plurality of memory cells (only two of them, $21_i$, $21_{i+1}$, being illustrated) are disposed in a matrix arrangement, at intersections of a plurality of pairs of bit lines, such as BL, $\overline{BL}$, a plurality of word lines, such as $WL_i$, $WL_{i+1}$. The memory cells $21_i$, $21_{i+1}$ and so on are formed of MOS transistors having a short gate length, so it is made to operate on an internal or auxiliary power source voltage $V_D$ (e.g., 3.3 V) of a lower level than the main power source $V_{CC}$ (e.g., 5 V).

The transfer gate section 30 is comprised of a plurality of pairs of n-channel MOS transistors (hereinafter referred to as NMOSTs) 31, 32 and so on, and which are turned on and off on the basis of a control signal TG to couple or isolate the pairs of bit lines BL, $\overline{BL}$, etc. and the pair of sense amplifier nodes SA, $\overline{SA}$, etc. The drains of the NMOSTs 31 and 32 are connected to the bit lines BL, $\overline{BL}$, and their sources are connected to the sense amplifier nodes SA, $\overline{SA}$, and their gates are commonly connected to receive the control signal TG.

The sense amplifier section 40 is comprised of a plurality of p-channel sense amplifiers 41 and so on, and n-channel sense amplifiers 42 and so on, connected to the respective pairs of bit lines BL, $\overline{BL}$.

For instance, the p-channel sense amplifiers 41 are comprised of two p-channel MOS transistors (hereinafter referred to as PMOSTs) 41a and 41b. The PMOST 41a has its drain connected to the sense amplifier node SA, its source connected to sense amplifier drive common node PS, and its gate connected to the sense amplifier node $\overline{SA}$. The PMOST 41b has its drain connected to the sense amplifier node $\overline{SA}$, its source connected to the common node PS, and its gate connected to the sense amplifier node SA.

The n-channel sense amplifiers 42 are comprised of two n-channel MOSTs 42a and 42b. The NMOST 42a has its drain connected to the sense amplifier node SA, its source connected to sense amplifier drive common node NS, and its gate connected to the sense amplifier node $\overline{SA}$. The PMOST 42b has its drain connected to the sense amplifier node $\overline{SA}$, its source connected to the common node NS, and its gate connected to the sense amplifier node SA.

The column decode section 50 comprises a plurality of pairs of NMOSTs 51, 52 for connecting and disconnecting of pairs of the sense amplifier nodes SA, $\overline{SA}$ and so on, and the pairs of data lines DB, $\overline{DB}$ and so on, and their gates are controlled by the column decoder output signal CL.

The power source supply control section 60 comprises a current mirror amplifier 70 serving as a comparing and amplifying means, and PMOST 80 and NMOST 81 serving as a power source supply means.

The current mirror amplifier 70 is activated by a control signal PAS, and compares and amplifies the voltage on the p-channel sense amplifier drive common node PS and a reference voltage $V_R$ of the same level as the auxiliary power source voltage $V_D$. It is comprised of two PMOSTs 71 and 72, and three NMOST 73, 74 and 75. The PMOST 80 serving as the power supply means has its drain and source respectively connected to the main power source voltage $V_{CC}$ and the common node PS, and its gate connected to the output of the amplifier 70. The NMOST 81 has its drain and source connected to the ground potential $V_{SS}$ and the n-channel sense amplifier drive common node NS, and its gate connected to receive the control signal PAS.

The operation of the circuit shown in FIG. 2 is described with reference to FIG. 3.

The read operation in which the memory cell $21_i$ is selected is as follows:

First, at time t0, the word line $WL_i$ is raised to the High level, $V_D+Vt+\alpha$ (Vt: threshold voltage of NMOST; and $\alpha$: a certain predetermined margin), and data is read from the memory cell $21_i$ to the bit line BL. As a result, the potential on the bit line BL and the sense amplifier node SA varies by the amount of the read signal from the precharge level (e.g., $V_D/2$).

At time t1, the control signal PAS is raised to the High level ($=V_{CC}$), and the NMOST 81 is turned on, and the n-channel sense amplifier drive common node NS varies to the Low level ($=V_{SS}$). At the same time, the NMOST 75 is turned on, and the amplifier 70 is activated, and by virtue of the Low level output of the amplifier 70, the PMOST 80 is turned on, and the p-channel sense amplifier drive common node PS is pulled up to the High level ($=V_D$). As a result, by the sensing and amplifying action of the p-channel sense amplifier 41 and the n-channel sense amplifier 42, charging and discharging of the pair of the sense amplifier nodes SA, $\overline{SA}$ and the pair of bit lines BL, $\overline{BL}$ are commenced.

At time t2, the common node PS reaches the $V_D$ level and the output of the amplifier 70 rises to the High level, and the PMOST 80 is turned off, and supply of electric charge from the main power source voltage $V_{CC}$ to the p-channel sense amplifier 41 is terminated.

The parasitic capacitance (=RC value) of the pair of bit lines BL, $\overline{BL}$ is large compared with the parasitic capacitance of the pair of sense amplifier nodes SA, $\overline{SA}$. Accordingly, accompanying the rise in the level of one of the bit lines BL, $\overline{BL}$ having the higher potential (e.g., $\overline{BL}$), the level of one of the sense amplifier nodes SA, $\overline{SA}$ having the higher potential (e.g., $\overline{SA}$), and the level of the common node PS are lowered, and the PMOST 80 is again turned on. The PMOST 80 is thus turned on and off repetitively several times, and up to time t4 when the bit line $\overline{BL}$ having the higher potential reaches the $V_D$ level, electric charge to the p-channel sense amplifier 41 is intermittently supplied.

At time t3, after the potential difference between the pair of sense amplifier nodes SA, $\overline{SA}$ becomes sufficient, the column decoder output signal CL is raised, and the NMOST 51 and 52 are turned on, and the read data is transferred to the pair of data lines DB, $\overline{DB}$. In preparation for rewriting in the memory cell $21_i$, the control signal TG is raised to the level of $V_D+Vt+\alpha$. Then, at time t4, the potential on the bit lines BL, $\overline{BL}$ become equal to the potentials on the sense amplifier nodes SA, $\overline{SA}$. The data on the sense amplifier nodes SA and $\overline{SA}$ are thereby rewritten in the memory cell $21_i$. The word line is thereafter lowered.

The device of the above-described configuration had the following drawbacks.

(i) In the conventional device, the control signal PAS is raised to the High level at time t1, to activate the current mirror amplifier 70, so that the amplifier 70 is kept activated. The power consumption at the amplifier 70 is therefore large.

(ii) The PMOST 80 is repetitively turned on and off during time t2 to t4, and electric charge is repetitively supplied from the main power source $V_{CC}$ to the p-channel sense amplifier 41 so time required for completing charging of the bit line BL or $\overline{BL}$ is long.

SUMMARY OF THE INVENTION

An object of the present invention is to provide a semiconductor memory device in which the power consumption at the current mirror amplifier is reduced, and the time for completing the charging of the bit line is shortened.

To solve the problems described above, the invention provides a semiconductor memory device comprising:

a main or first primary power source providing a first power source voltage ($V_{CC}$);

an auxiliary or second power source providing a second power source voltage ($V_D$) lower than said first power source voltage ($V_{CC}$);

a plurality of memory cells ($21_i$, $21_{i+1}$) disposed at intersections of a plurality of bit lines (BL, $\overline{BL}$) and a plurality of word lines ($WL_i$, $WL_{i+1}$) and operating on the second power source voltage ($V_D$);

a plurality of sense amplifiers (41) activated by a voltage on a drive common node (NS) and sensing and amplifying the voltage on a corresponding one of the bit line;

a comparing means (110) activated by said control signal (PAS) and comparing the voltage on the common node (PS) and said second power source voltage ($V_D$), the comparing means having an output which is in a first state when the voltage on the common node (PS) is not higher than the reference voltage ($V_R$) and which is in a second state when the voltage on the common node (PS) exceeds the reference voltage ($V_R$); and a first power source supply means (130, 132) controlled in accordance with the output of said comparing means (110) and supplying a drive voltage to said common node (PS) when said control signal (PAS) is active;

characterized by further comprising:

a latch means (120) selectively assuming a first state and a second state, receiving the control signal (PAS) and the output of said comparing means (110), turned from the first state to the second state when the control signal (PAS) is turned active, thereby to activate the comparing means (110) and the first power source supply means (130, 132), and turned from the second state to the first state when the output of said comparing means (110) is turned to from the first state to the said second state, said latching means deactivating the comparing means (110) when it is turned to the first state.

In the semiconductor memory device configured as described above, when the control signal rises to the High level, the latch means is turned from the first state to the second state, and the comparing means and the first power source supply means are thereby activated. The first power source supply means then supplies the drive voltage from the power source to the common node, to activate the sense amplifier. The sense amplifier then senses and amplifies the minute potential on the bit line. The potential on the common node is compared with the reference voltage by the comparing means, and when the potential on the common node is raised to the level of the second power source voltage, for example, the latching means is returned from the second state to the first state. Then, the operation of the comparing means is terminated. The period for which the comparing means is activated is therefore shortened, and the power consumption is reduced.

The semiconductor memory device may further be provided with a second power source supply means (131, 133) supplying the drive voltage to said common node (PS) in accordance with said control signal (PAS). When the control signal goes High, the second power source supply means is activated to supply the drive voltage to the common node. The drive voltage is supplied continuously via the common node to the sense amplifier, so the time taken to complete the charging, for example, of the bit line is shortened, and the operation speed is further increased.

The semiconductor memory may further be provided with a monitor means (150) receiving the voltage on the common node (PS) and detecting the voltage level on the bit line and applying the result of the detection to the comparing means (110).

When the power source supply means supplies the drive voltage to the common node, the potential on the common node is input to the monitor means. The monitor means monitors, on the basis of the voltage on the common node, the voltage level on the bit line. The result of monitoring lags behind the voltage rise, for example, on the common node. The lagging result of monitoring is compared with the reference voltage at the comparing means, so the operation for returning the latching means to the first state responsive to the output of the comparing means lags, and, as a result, the first power source supply means continues supplying the drive voltage for a longer period, and raises the common node above the second power source voltage. As a result, the charging and discharging of the bit line by the sense amplifier are made at a higher speed.

DETAILED DESCRIPTION OF THE PREFERRED EMBODIMENTS

First Embodiment

Figure 1:
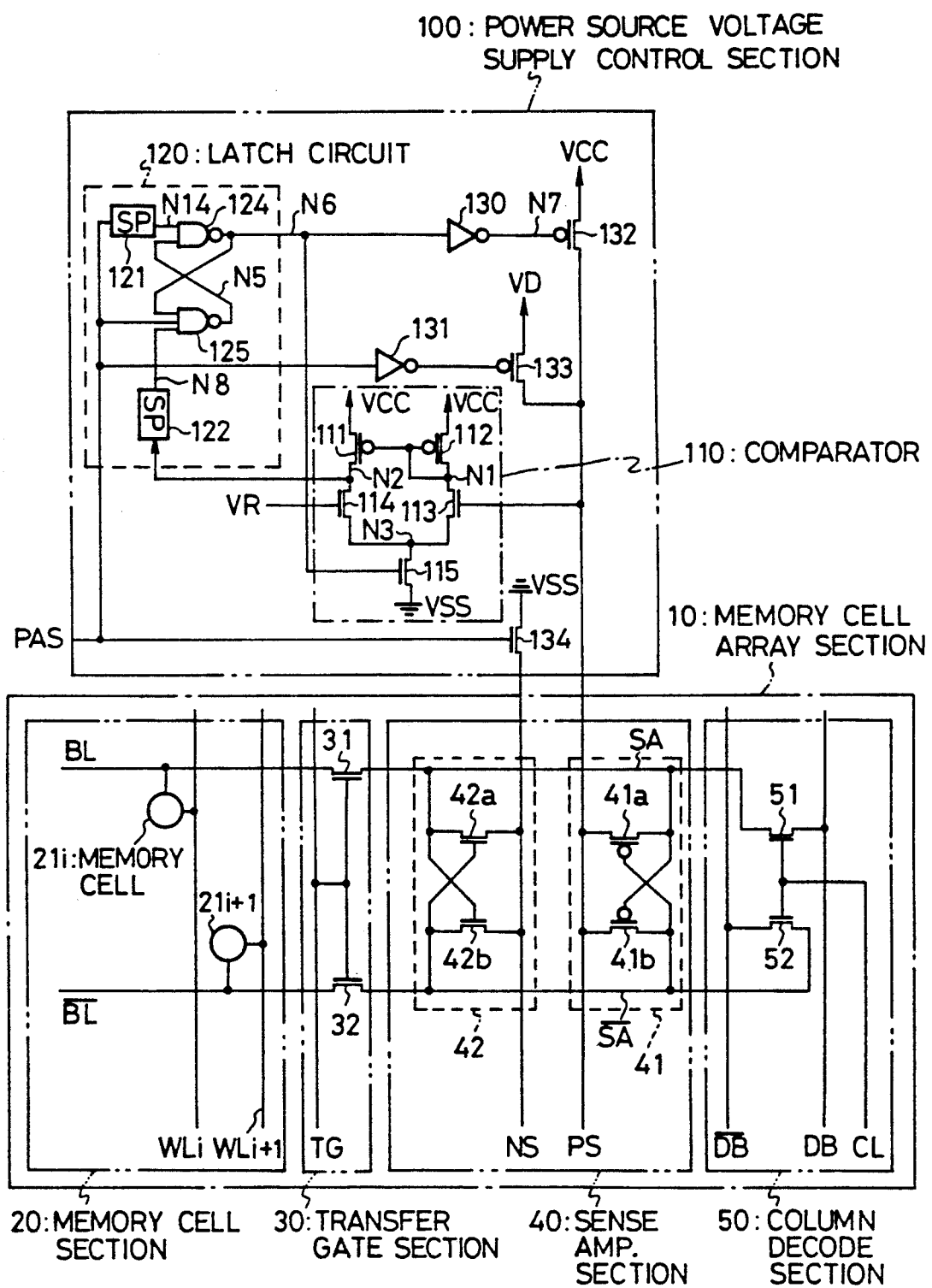
FIG. 1 is a circuit diagram showing the pertinent portion of a semiconductor memory device of a first embodiment of the invention.
Figure 2:
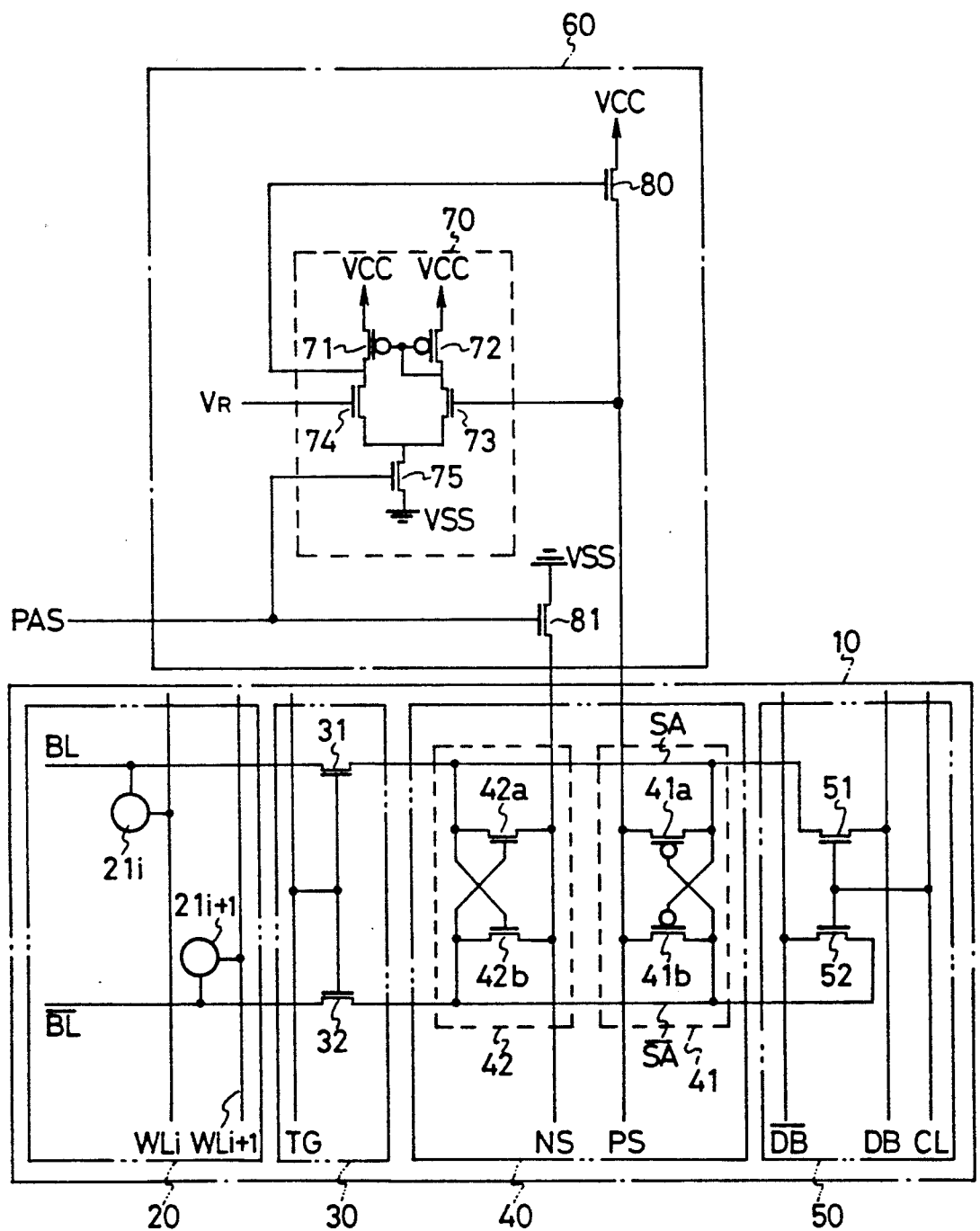
FIG. 2 is a circuit diagram showing the pertinent portion of the semiconductor memory device in the prior art.
Figure 3:
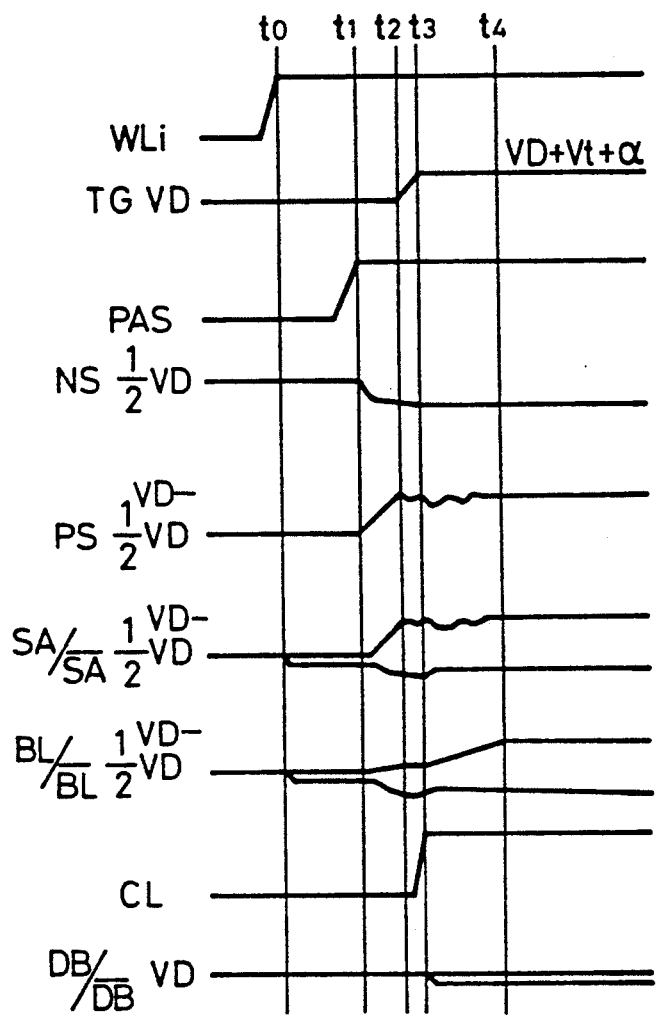
FIG. 3 is a waveform diagram showing the operation of the circuit of FIG. 2.

FIG. 1 is a circuit diagram of the pertinent portion of the semiconductor memory device of an embodiment of the invention. Elements common with the elements in the prior art of FIG. 2 are given identical reference marks.

The semiconductor memory device is a dynamic RAM, and comprises a memory cell array section 10 identical to that of the prior art, and a power source voltage supply control section 100 which differs from that of the prior art.

The power source voltage supply control section 100 supplies a drive voltage to the memory cell array 10, and is comprised of a comparator 110, which also has the function of amplification, a latch circuit 120, serving as a latching means, inverters 130 and 131 for inverting the signal, a PMOST 132 and an NMOST 134 serving as a main power source supply means, and a PMOST 133 serving as an auxiliary power source supply means. The PMOST 134 serves also as part of the auxiliary power source supply means.

The comparator 110 is in the form of a current mirror amplifier which compares and amplifies the reference voltage $V_R$ (the same level as the auxiliary voltage $V_D < V_{CC}$) and the voltage on the p-channel sense amplifier drive common node PS, and is comprised of PMOSTs 111 and 112, and NMOSTs 113, 114 and 115 connected as illustrated.

The sources of the PMOSTs 111 and 112 are connected to the power source voltage $V_{CC}$, and their gates are commonly connected to the drain node N1 of the PMOST 112. The drain node N1 of the PMOST 112 is connected via the NMOST 113 to a node N2, and the gate of the NMOST 111 is connected to the common node PS. The drain node of the PMOST 113 is connected via the NMOST 114 to the node N3. The gate of the NMOST 114 is connected to the reference voltage $V_R$. The node N3 is connected via the NMOST 115 to the ground potential $V_{SS}$. The node N2 is connected to the latch circuit 120.

The latch circuit 120 latches the rise of the High level, for example, of the control signal PAS. In other words, the latch circuit 120 can assume either of a first state and a second state, and is turned from the first state to the second state when the control signal PAS rises from the Low level to the High level, and is turned from the first state to the second state when the output of the comparator 110 at the node N2 rises. When the latch circuit 120 is in the second state, its output, at a node N6, is High to activate the comparator 110 and turns on the PMOST 132. When the latch circuit 120 is in the first state, its output, at the node N6, is Low to deactivate the comparator 110 and turn off the PMOST 132.

The latch circuit 120 is comprised of one-shot pulse generator circuits 121 and 122, and NAND gates 124 and 125. The control signal PAS is connected via the one-shot pulse generator circuit 121 to the node N4, which is connected to one input of the NAND gate 124. The output of the NAND gate 124 is connected to the node N6, which is connected to one input of the NAND gate 125. The control signal PAS is connected to another input of the NAND gate 125. A third input of the NAND gate 125 is connected to a node N8, which is connected to the output of the one-shot pulse generator circuit 122, of which the input is connected to the node N2, later described. The output of the NAND gate 125 is connected to a node N5, which is connected to a second input of the NAND gate 124. In this way, the NAND gates 124 and 125 are crossed coupled.

The node N6 is connected via the inverter 130 and the node N7 to the gate of the PMOST 132, and the source of the PMOST 132 is connected to the power source voltage $V_{CC}$, and its drain is connected to the p-channel sense amplifier drive common node PS. The control signal PAS is connected via the inverter 131 to the gate of the PMOST 133, and the source of the PMOST 133 is connected to the auxiliary power source voltage $V_D$, and its drain is connected to the common node PS. The control signal PAS is connected to the gate of the NMOST 134, and the source of the NMOST 134 is connected to the ground potential $V_{SS}$, and its drain is connected to the n-channel sense amplifier drive common node NS.

Figure 4:
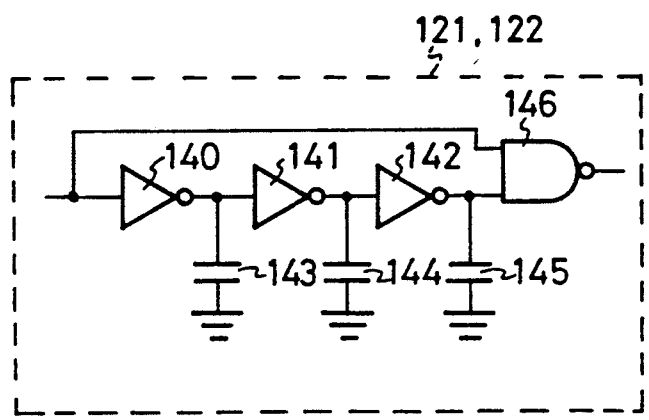
FIG. 4 is a circuit diagram showing a one-shot pulse generating circuit in FIG. 1.

FIG. 4 is a circuit diagram showing an example of the one-shot pulse generator circuit 121 or 122 in FIG. 1.

The one-shot pulse generator circuit 121 or 122 is a circuit for generating an inverted single pulse at the rising edge of the input signal, and is comprised of a cascaded inverters 140 to 142, and capacitors 143 to 145 connected between the outputs of the inverters 140 to 142 and the ground potential $V_{SS}$, and a NAND gate 146 performing a logical NAND operation on the input signal and the output signal of the inverter 142.

The operation of the circuit shown in FIG. 1 will now be described with reference to FIG. 5.

The reading operation in the case when the memory cell $21_i$ in FIG. 1 is selected will now be described.

At time t0, the word line $WL_j$ is raised to the High level, $V_D + Vt + \alpha$ (Vt: threshold voltage of NMOST; and $\alpha$: a certain predetermined margin), and data is read from the memory cell $21_i$ to the bit line BL. As a result, the potential on the bit line BL and the sense amplifier node SA varies by the amount of the read signal from the precharge level ($V_D/2$).

At time t1, the control signal PAS is raised to the High level ($=V_{CC}$), then the NMOST 134 is turned on and the PMOST 133 is turned on via the inverter 131. Furthermore, responsive to the rise of the control signal PAS, an inverted one-shot pulse is output from the one-shot pulse generator circuit 121 to the node N4. The fall of the node N4 is transferred through the NAND gates 124 and 125, and the output node N6 of the NAND gate 124 rises, and the output node N5 of the NAND gate 125 falls. The crossed-coupled NAND gates 124 and 125 are held in this state. Thus, the latch circuit 120 is turned from the first state to the second state responsive to the rise of the control signal PAS and is held in the second state. The rise of the node N6 is transferred through the inverter 130 and the node N7, and the PMOST 132 is turned on, and the NMOST 115 is turned on, and the comparator 110 is activated.

As the NMOST is turned on a current flows through the node N2, the NMOST 114, the node N3, and the NMOST 115 and to the ground $V_{SS}$. As a result, the potential on the node N2 falls a little.

As the NMOST 134 is turned on, the n-channel sense amplifier drive common node NS is pulled down to the ground level $V_{SS}$. Furthermore, as the PMOST 132 is turned on, the p-channel sense amplifier drive node PS is raised toward the auxiliary power source voltage $V_D$ level. Then, the p-channel sense amplifier 41 and the n-channel sense amplifier 42 are activated, and because of their sensing and amplifying operation, one of the sense amplifier nodes, e.g., $\overline{SA}$, and one of the bit line, e.g., $\overline{BL}$, which are higher are charged and those which are lower, e.g., SA and BL, are discharged.

At time t2, when the p-channel sense amplifier drive common node PS reaches the $V_D$ level, the node N2 will be at the power source voltage $V_{CC}$ level. That is, when the common node PS reaches the $V_D$ level, the node N1 falls from the $V_{CC}$ level to the $V_{SS}$ level, and as a result, the output node N2 returns to the $V_{CC}$ level. Then, an inverted one-shot pulse is generated on the output node N8 of the one-shot pulse generator circuit 122 in the latch circuit 120 generates, and this one-shot pulse is input to the NAND gate 125, with the result that the output node N6 of the NAND gate 124 falls from the High level to the Low level. In other words, the latch circuit 120 is returned from the second state to the first state.

The fall of the node N6 is transferred via the inverter 130, and the PMOST 132 is turned off, and the supply of the electric charge from the power source voltage $V_{CC}$ to the p-channel sense amplifier 41 is terminated, and the NMOST 115 is turned off and the comparator 110 is deactivated. After this, the supply of the electric charge to the p-channel sense amplifier 42 is made only from the auxiliary power source voltage $V_D$ via the PMOST 133.

When an adequate potential difference is created between the pair of sense amplifier nodes SA and $\overline{SA}$, at time t3, the column decoder output signal CL is raised to the High level to turn on the NMOSTs 51 and 52, thereby to transfer the data from the pair of sense amplifier nodes SA and $\overline{SA}$ to the pair of data lines DB and $\overline{DB}$. Furthermore, in preparation for the rewriting in the memory cell $21_i$, the control signal TG is raised from the $V_D$ level to the $V_D+Vt+\alpha$ level, and the potentials on the bit lines BL and $\overline{BL}$ are made equal to the potentials on the sense amplifier nodes SA and $\overline{SA}$. The potentials on the sense amplifier nodes SA and $\overline{SA}$ are thereby written via the bit lines into the memory cell $21_i$. After this, the word lines $WL_i$ are lowered to the Low level (=0 V).

This first embodiment has the following advantages:

(a) Since the latch circuit 120 is provided, responsive to the rise of the control signal PAS, the output node N6 of the latch circuit 120 is raised to the High level and the PMOST 132 is turned on, and the supply of electric charge to the p-channel sense amplifier 41 is conducted, and the comparator 110 is activated. When the common node PS rises to the $V_D$ level, the output node N2 of the comparator 110 becomes the $V_{CC}$ level, and the output node N6 of the latch circuit 120 becomes the Low level, and the comparator 110 is deactivated. Accordingly, the time for which the comparator 110 is activated is minimized, and the current through the comparator 110 is reduced, and the power consumption is reduced.

(b) The PMOST 133 is provided as an auxiliary power source supply means, and is on for the period for which the control signal PAS is at the High level, and the electric charge is supplied from the auxiliary power source voltage $V_D$ to the p-channel sense amplifier 41. Accordingly, after the PMOST 132 has been turned off, the PMOST 133 keeps supplying the electric charge to the p-channel sense amplifier 41, and the time for charging the bit line BL or $\overline{BL}$ is shortened, and the operation speed is heightened.

Second Embodiment

Figure 6:
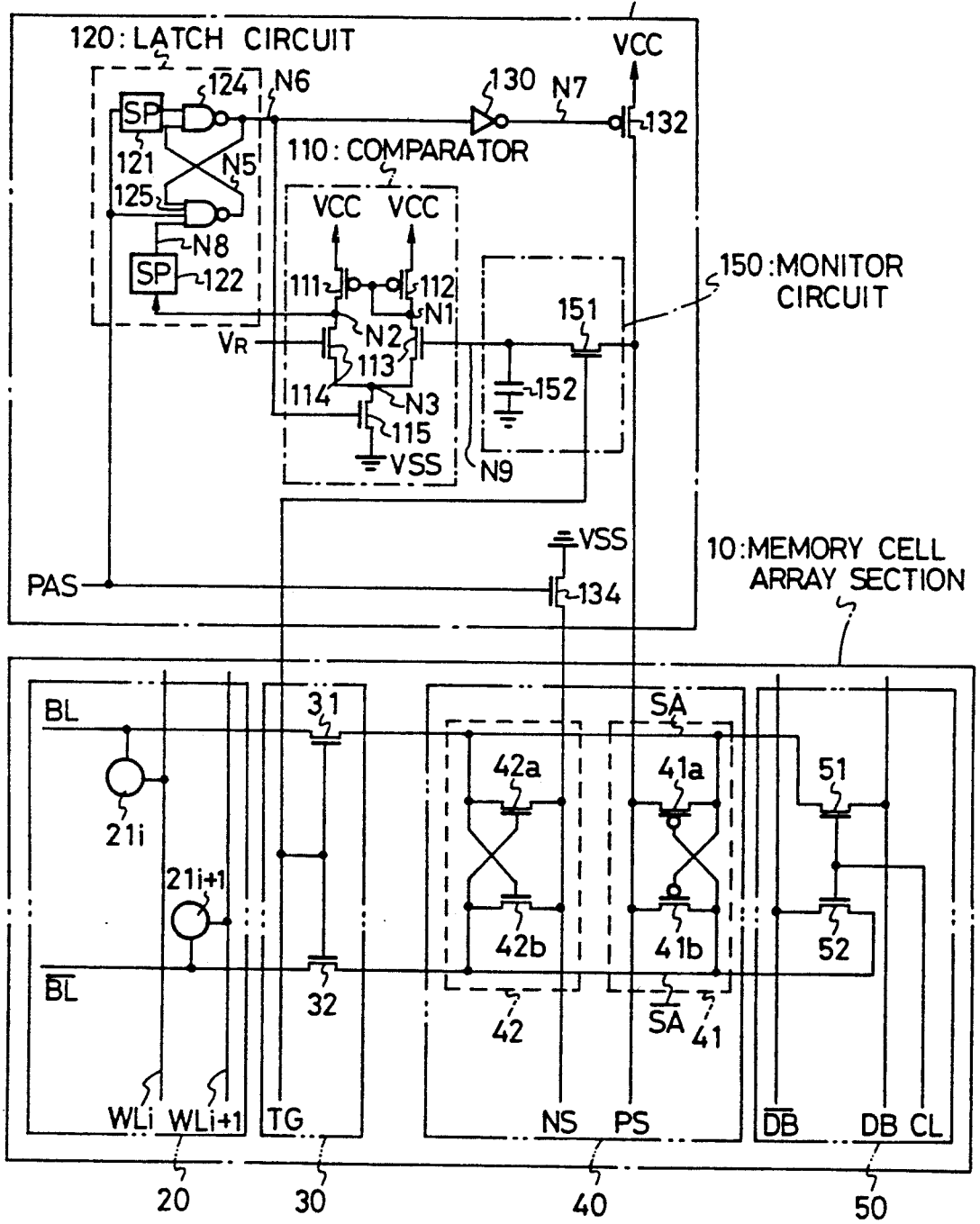
FIG. 6 is a circuit diagram showing the pertinent portion of a second embodiment of the invention.

FIG. 6 is a circuit diagram showing the pertinent portion of the semiconductor memory device of a second embodiment of the invention. Elements identical to those in FIG. 1 are given identical or common reference marks.

The power source voltage supply control section 100A of this semiconductor memory device differs from that of FIG. 1 in that, in place of the PMOST 133 and the inverter 131, a monitor circuit 150 serving as a monitor means is provided. In other respects, the configuration is identical to the power source voltage supply control section 100 of FIG. 1.

The monitor circuit 150 is disposed between the p-channel sense amplifier drive common node PS and the input node N9 of the comparator 110, and has the functions of monitoring the voltage level of the higher one of the bit lines BL and $\overline{BL}$, and applying the result of the monitoring to the input node N9.

The monitor circuit 150 comprises a NMOST 51 having the same characteristics as the NMOSTs 31 and 32 in the transfer gate section 30, and a bit line capacitor 152 formed of a MOS capacitor or the like. The drain and the source of the NMOST 151 are connected to the common node PS and the input node N9 of the comparator 110, and the gate of the NMOST 151 is connected to receive the control signal TG. The input node N9 is connected via the bit line capacitor 152 to the ground potential $V_{SS}$.

Figure 7:
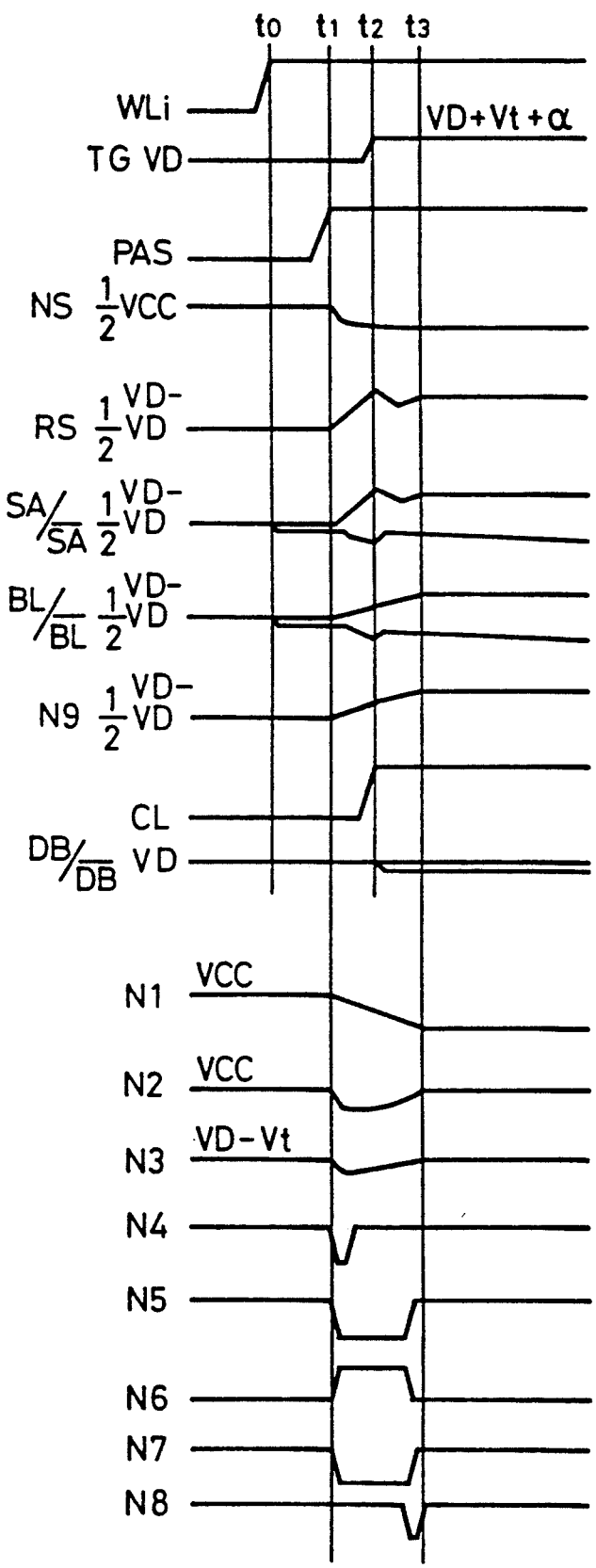
FIG. 7 is a waveform diagram showing the operation of the circuit of FIG. 6.

The operation of the circuit shown in FIG. 6 will now be described with reference to FIG. 7.

For example, let us assume that the memory cell $21_i$ is selected for reading, as in the description of the operation of the circuit of FIG. 1.

Figure 5:
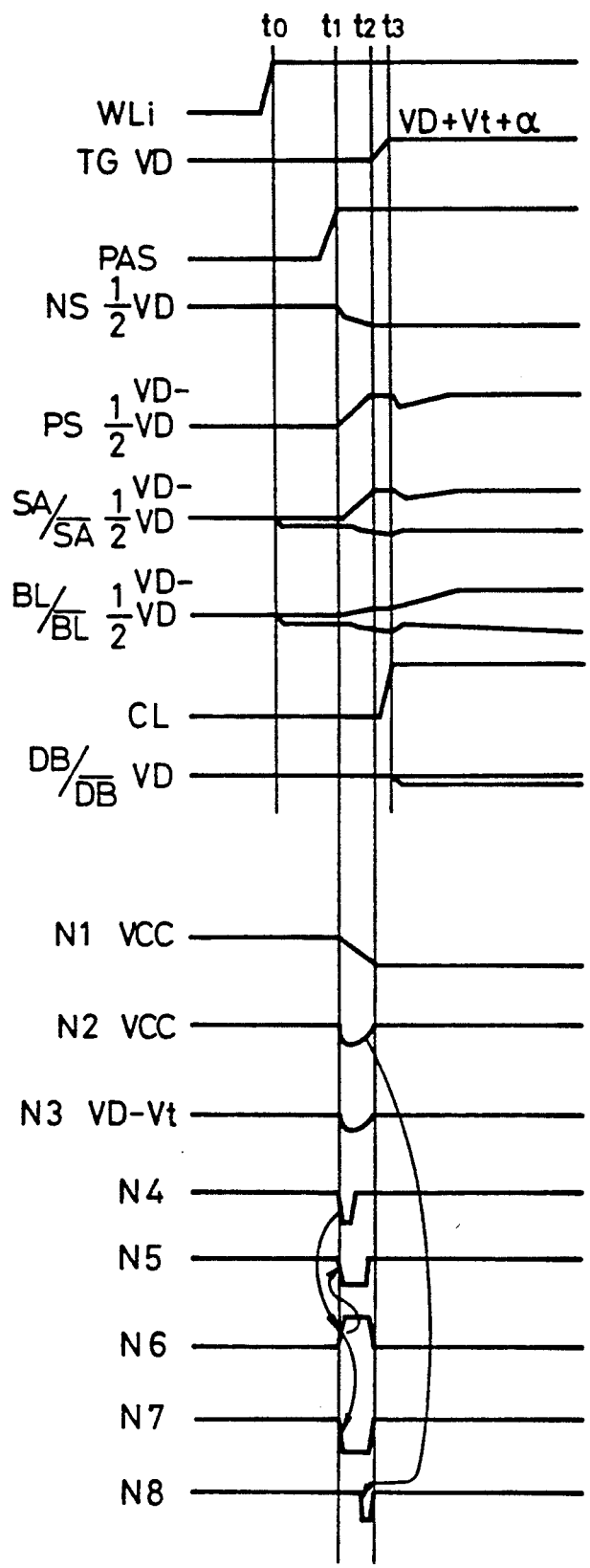
FIG. 5 is a waveform diagram showing the operation of the circuit of FIG. 1.

At time t0, the word line $WL_i$ is raised to the High level, $V_D+Vt+\alpha$, and as in the waveform of FIG. 5, the potential on the bit line BL and the sense amplifier node SA varies by the amount of the read signal from the precharge level (e.g., $V_D/2$).

At time t1, the control signal PAS is raised to the High level (=$V_{CC}$). Then, the NMOST 134 is turned on, and the n-channel sense amplifier drive common node NS falls to $V_{SS}$ level. At the same time, as in FIG. 5, the rise of the output node N6 of the latch circuit 120 turns on the PMOST 132, and turns on the NMOST 115, to activate the comparator 110. When the PMOST 132 is turned on, the p-channel sense amplifier drive common node PS is raised to $V_D$ by virtue of the main power source voltage $V_{CC}$.

By the sensing and amplifying action of the sense amplifiers 41 and 42, one of the sense amplifier nodes SA and $\overline{SA}$ which is higher, e.g., $\overline{SA}$, and one of the bit lines BL and $\overline{BL}$ which is higher, e.g., $\overline{BL}$, are charged, and the lower sense amplifier node, e.g., SA and the lower bit line, e.g., BL, are discharged.

While the PMOST 132 is on, the common node PS rises beyond the $V_D$ level toward the $V_{CC}$ level. The common node PS thereby exceeds the $V_D$ level, and, by the action of the monitor circuit 150, the input node N9 of the comparator 110 rises to the same level as the higher one of the bit lines, e.g., $\overline{BL}$, and until then, the output node N2 of the comparator 110 is kept lower than the $V_{CC}$ level. For this reason, the latch circuit 120 continues to be in the second state, and its output node N6 is kept High, so the PMOST 132 is kept on, and the supply of electric charge to the p-channel sense amplifier 41 is continued. Accordingly, charging and discharging of the sense amplifier nodes SA and $\overline{SA}$ and the bit lines BL and $\overline{BL}$ are accomplished at a high speed.

After an adequate potential difference is created between the sense amplifier nodes SA and $\overline{SA}$, at time t2, the decoder output signal CL rises, and the data is transferred to the pair of data lines DB and $\overline{DB}$. In preparation for the rewriting into the memory cell $21_i$, in the same way as in FIG. 1, the control signal TG is raised to $V_D + Vt + \alpha$.

As a result, the level of the higher one of the bit lines, e.g., $\overline{BL}$, rises again. But, as the common node PS and the higher one of the sense amplifier nodes, e.g., $\overline{SA}$, have been charged above the $V_D$ level, the higher bit line $\overline{BL}$ rapidly rises, and reaches the $V_D$ level at time t3. In the same way, the input node N9 of the comparator 110 reaches the $V_D$ level, and, at this instance, the output node N2 of the comparator 110 returns to the $V_{CC}$ level, and the latch circuit 20 is returned from the second state to the first state, and the output node N6 falls to the Low level. This is transferred via the inverter 130 and the node N7, and the PMOST 132 is turned off, so the supply of electric charge to the p-channel sense amplifier 41 is terminated, and the NMOST 115 is turned off and the comparator 110 is deactivated.

The advantages of the second embodiment are as follows:

(a) Since the monitor circuit 150 is provided, it is possible to supply the electric charge, with a voltage higher than in the first embodiment, to the p-channel sense amplifier 41 via the PMOST 132 which is kept on until the higher one of the bit line, e.g., $\overline{BL}$, reaches the $V_D$ level. Accordingly, the charging of the bit line, e.g., $\overline{BL}$, can be completed in a shorter time, than in the first embodiment.

(b) At the same time as the completion of the charging of the bit line, e.g., $\overline{BL}$, the latch circuit 120 is returned from the second state to the first state by the output of the comparator 110, and the comparator 110 is deactivated by the output of the latch circuit 120, so the current consumed by the comparator 110 is reduced and the reduction in power consumption is achieved.

The present invention is not limited to the illustrated embodiments. Examples of modifications are as follows:

(i) The comparator 110 may be formed of other transistors and the like, and may be replaced by a circuit of any different configuration or any other type of comparing means.

(ii) The latch circuit 120 may be formed of latch means using other gate circuits such as NOR gates.

(iii) The main power source supply means and the auxiliary power source supply means may be formed of other types of transistors. The monitor circuit 150 serving as an auxiliary power source supply means may be of a circuit configuration employing other transistors and the like.

(iv) The memory cell array section 10 may be formed of a circuit other than that illustrated. The invention can be applied to semiconductor memory devices, such as static RAMs, other than dynamic RAMs.

As has been described, according to the invention, a latch means is provided, so by the action of the latch means, the comparing and amplifying means is deactivated immediately upon completion of the bit line charging, and the current consumed at the comparing and amplifying means is reduced, and the power consumption is thereby reduced.

An auxiliary power source supply means may additionally be provided. In such a case, when the main power source supply means is off, the auxiliary power source supply means continues the supply of the electric charge from the power source to the sense amplifier until the potential on the bit line reaches a predetermined level, so the charging of the bit line is accomplished with a high speed, and the high speed operation is thereby enabled.

In the embodiment of FIG. 6, in which a monitor means is provided, the return of the latch circuit from the second state to the first state responsive to the output of the comparing and amplifying means is retarded, and by means of the output of the latch means, the main power source supply means is kept on. Accordingly, the electric charge is kept supplied from the main power source to the sense amplifier until the potential on the bit line reaches a predetermined level, so the charging of the bit line is accomplished with a high speed, and the high-speed operation is possible.

What is claimed is:

1. A semiconductor memory device comprising:
   a first power source providing a first power source voltage;
   a second power source providing a second power source voltage lower than said first power source voltage;
   a plurality of memory cells disposed at intersections of a plurality of bit lines and a plurality of word lines and energized from the second power source voltage;
   a plurality of sense amplifiers activated by a voltage on a drive common node and sensing and amplifying the voltage on a corresponding one of the bit lines;
   a comparing means activated by a control signal and comparing the voltage on the drive common node and said second power source voltage, the comparing means having an output which is in a first state when the voltage on the common node is not higher than said second power source voltage and which is in a second state when the voltage on the common node exceeds the second power source voltage;
   a first power source supply means supplying a drive voltage to said common node when said control signal is active; and, a latch means selectively assuming a first state and a second state, and receiving the control signal and the output of said comparing means, said latch means being turned from the first state to the second state when the control signal is turned active, thereby activating the comparing means and the first power source supply means, and being turned from the second state to the first state when the output of said comparing means is turned from the first state to the said second state, said latch means being connected for deactivating the comparing means when said latch means is turned to the first state.

2. The device of claim 1, further comprising a data line driven by said first power source, with data to be written to read out of the memory cells being transferred between said sensing amplifiers and said data line.

3. The device of claim 1, wherein said drive voltage supplied by said first power source supply means is said first power source voltage.

4. The device of claim 1, wherein said first power source supply means supplies the drive voltage to the common node when the latch means is in said second state, and does not supply the drive voltage to the common node when the latch means is in said first state.

5. The device of claim 1, wherein said comparing means is a current mirror amplifier.

6. The device of claim 1, wherein said control signal is raised to a high level during reading at a time point when the data is to be read from the memory cell to the bit line.

7. The device of claim 1, wherein said first power source supply means comprises a switch coupling the common node with said first power source.

8. The device of claim 1, further comprising:
a second power source supply means supplying the drive voltage to said common node in accordance with said control signal.

9. The device of claim 8, wherein said second power source supply means supplies the drive voltage to said common node when the control signal is active.

10. The device of claim 8, wherein the drive voltage supplied by said second power source supply means is said second power source voltage.

11. The device of claim 8, wherein said second power source supply means comprises a switch coupling the common node with said second power source.

12. The device of claim 1, further comprising:
a monitor means receiving the voltage on the common node and detecting the voltage level on the bit line and applying the result of the detection to the comparing means.

13. The device of claim 12, wherein said monitor means comprises a switch coupling the common node with the comparing means, and being controlled by another control signal, a capacitor connected across the input of said comparing means and ground, said another control signal being active when the bit line of the sense amplifier is to be coupled, whereby the potential on the common node is being transferred to the input of said comparing means with a delay due to said capacitor.

14. The device of claim 1, wherein said latch means has a first input terminal connected to receive the control signal, a second input terminal connected to receive the output signal of said comparing means, and an output terminal connected to a control terminal of said comparing means and to a control terminal of said first power source supply means.

15. A semiconductor memory device comprising:
a first ground node to be maintained at a ground potential;
a first voltage node to be maintained at a first voltage potential;
a second voltage node to be maintained at a second voltage potential between the ground potential and the first voltage potential;
first and second bit lines coupled to a plurality of memory cells for storing data therein;
a plurality of word lines respectively coupled to one of said memory cells, with one said word lines being selected in an active operating cycle so as to cause a first potential difference between said first and second bit lines due to the data stored in the memory cell coupled to the selected word line;
a sense amplifier having first and second sense nodes on which a second potential difference, substantially corresponding to said first potential difference, appears at a given time in the active operating cycle;
said sense amplifier, having a third voltage node and a second ground node, for amplifying said second potential difference between said first and second sense nodes;
a first switch connecting said first ground node and said second ground node;
a second switch connecting said third voltage node and said first voltage node;
a third switch connecting said third voltage node and said second voltage node; and
a control circuit to control said first, second and third switches so that said first switch is switched to an ON status after the given time in the active operating cycle, so that said second switch is switched to an ON status during a period of time after the given time in the active operating cycle, and so that said third switch is switched to an ON status after the given time in the active operating cycle, whereby said sense amplifier quickly amplifies said second potential difference between said first and second sense nodes up to a third potential difference between said first ground node and said second voltage node after the given time in the active operating cycle.

16. A semiconductor memory device according to claim 15, wherein said control circuit has a detector to detect when said third voltage node is changed to the second voltage potential; and wherein said control circuit switches said second switch to an OFF status to define the end of said period of time when said detector detects said third voltage node changing to the second voltage potential.

17. A semiconductor memory device according to claim 15, wherein said first, second and third switches are substantially coincidentally switched to an ON status after the given time in the active operating cycle.

18. A semiconductor memory device according to claim 17, wherein said first, second and third switch are respectively switched to an OFF status prior to the given time in the active operating cycle.

19. A semiconductor memory device according to claim 18, wherein said control circuit has a detector to detect when said third voltage node changing to the second voltage potential; and wherein said control circuit switches said second switch to an OFF status to define the end of said period of time when said detector detects said third voltage node changing to the second voltage potential.

20. A semiconductor memory device comprising:
a first ground node to be maintained at a ground potential;
a first voltage node to be maintained at a first voltage potential;
a second voltage node to be maintained at a second voltage potential between the ground potential and first voltage potential;
first and second bit lines coupled to a plurality of memory cells for storing data therein;
a plurality of word lines respectively coupled to one of said memory cells, with one of said word lines being selected in an active operating cycle so as to cause a first potential difference between said first and second bit lines due to the data stored in the memory cell coupled to the selected word line;
a sense amplifier having first and second sense nodes on which a second potential difference, substantially corresponding to said first potential difference, appears at a given time in the active operating cycle;
said sense amplifier, having a third voltage node and a second ground node, for amplifying said second potential difference between said first and second sense nodes;
a first switch connected between said first ground node and said second ground node;
a second switch connected between said third voltage node and said first voltage node;
a control circuit to control said first and second switches so that said first switch is switched to an ON status after the given time in the active operating cycle and so that said second switch is switched to an ON status in a period of time after the given time in the active operating cycle;
said control circuit having a detector, having a reference node which is connected to said second voltage node and a detection node, to detect when said detection is changed to the second voltage potential;
a first NMOS transistor, having a first gate electrode, connecting said first bit line and said first sense node;
a second NMOS transistor, having a second gate electrode, connecting said second bit line and said second sense node;
a bit line capacitance coupled to said detection node;
a third NMOS transistor, having a third gate electrode, connecting said third voltage node and said detection node;
a gate control line, commonly connected to said first, second and third gate electrodes;
means for maintaining said gate control line at the second voltage potential until said sense amplifier sufficiently amplifies said second potential difference based upon a third potential difference between said first ground nodes and said first voltage node after the given time in the active operating cycle, and for thereafter raising said gate control line to a third voltage potential sufficiently higher than said second potential; and
said control circuit switching said second switch to an OFF status to define the end of said period of time when said detector detects the detection node changing to the second voltage potential.

21. A semiconductor memory device according to claim 20, wherein said first and second switches are substantially coincidentally switched to an ON status after the given time in the active operating cycle.

22. A semiconductor memory device according to claim 21, wherein said first and second switches are respectively switched to an OFF status prior to the given time in the active operating cycle.

* * * * *